(12) United States Patent
Umezawa et al.

(10) Patent No.: US 12,261,138 B2
(45) Date of Patent: Mar. 25, 2025

(54) TERMINAL AND CONNECTION METHOD

(71) Applicants: SONY GROUP CORPORATION, Tokyo (JP); SONY SEMICONDUCTOR SOLUTIONS CORPORATION, Kanagawa (JP)

(72) Inventors: Jo Umezawa, Kanagawa (JP); Matthew Lawrenson, London (GB); Bernadette Elliott-Bowman, London (GB); Christopher Wright, London (GB); Timothy Beard, London (GB)

(73) Assignees: SONY SEMICONDUCTOR SOLUTIONS CORPORATION, Kanagawa (JP); SONY GROUP CORPORATION, Tokyo (JP)

( * ) Notice: Subject to any disclaimer, the term of this patent is extended or adjusted under 35 U.S.C. 154(b) by 314 days.

(21) Appl. No.: 17/904,390

(22) PCT Filed: Jan. 15, 2021

(86) PCT No.: PCT/JP2021/001298
§ 371 (c)(1),
(2) Date: Aug. 17, 2022

(87) PCT Pub. No.: WO2021/171823
PCT Pub. Date: Sep. 2, 2021

(65) Prior Publication Data
US 2023/0075929 A1 Mar. 9, 2023

(30) Foreign Application Priority Data
Feb. 28, 2020 (JP) .................................. 2020-032987

(51) Int. Cl.
*H01L 23/00* (2006.01)

(52) U.S. Cl.
CPC .............. *H01L 24/13* (2013.01); *H01L 24/05* (2013.01); *H01L 24/11* (2013.01); *H01L 24/16* (2013.01);
(Continued)

(58) Field of Classification Search
CPC ......... H01L 24/13; H01L 24/05; H01L 24/11; H01L 24/16; H01L 24/81;
(Continued)

(56) References Cited

U.S. PATENT DOCUMENTS

| | | | |
|---|---|---|---|
| 6,064,120 A * | 5/2000 | Cobbley | ................. H01L 24/81 257/781 |
| 2006/0046468 A1 * | 3/2006 | Akram | .............. H01L 21/76898 257/E21.597 |
| 2021/0272908 A1 * | 9/2021 | Sinha | ................. H01L 23/4985 |

FOREIGN PATENT DOCUMENTS

| | | |
|---|---|---|
| JP | 04-137630 A | 5/1992 |
| JP | 07-246492 A | 9/1995 |

(Continued)

OTHER PUBLICATIONS

International Search Report and Written Opinion of PCT Application No. PCT/JP2021/001298, issued on Apr. 6, 2021, 08 pages of ISRWO.

*Primary Examiner* — Karen Kusumakar
*Assistant Examiner* — Shawn Shaw Muslim
(74) *Attorney, Agent, or Firm* — CHIP LAW GROUP (57) ABSTRACT

An object of the present technology is to prevent damage in a bonded portion between a semiconductor chip and a substrate in a semiconductor device in which the semiconductor chip is mounted on the substrate.
A terminal is disposed between an electrode of an element and an electrode of a substrate on which the element is mounted, and electrically connects the electrode of the element and the electrode of the substrate. The terminal
(Continued)

includes a plurality of unit lattices and a coupling portion. The unit lattices included in the terminal are formed by bonding a plurality of beams in a cube shape. The coupling portion included in the terminal couples adjacent unit lattices among the plurality of unit lattices.

11 Claims, 6 Drawing Sheets

(52) U.S. Cl.
CPC .... *H01L 24/81* (2013.01); *H01L 2224/05624* (2013.01); *H01L 2224/05644* (2013.01); *H01L 2224/05791* (2013.01); *H01L 2224/05805* (2013.01); *H01L 2224/05809* (2013.01); *H01L 2224/05839* (2013.01); *H01L 2224/1131* (2013.01); *H01L 2224/11515* (2013.01); *H01L 2224/119* (2013.01); *H01L 2224/13005* (2013.01); *H01L 2224/13011* (2013.01); *H01L 2224/13016* (2013.01); *H01L 2224/1319* (2013.01); *H01L 2224/13339* (2013.01); *H01L 2224/13347* (2013.01); *H01L 2224/1379* (2013.01); *H01L 2224/13839* (2013.01); *H01L 2224/16227* (2013.01); *H01L 2224/81201* (2013.01); *H01L 2224/81444* (2013.01); *H01L 2224/81591* (2013.01); *H01L 2224/81605* (2013.01); *H01L 2224/81609* (2013.01); *H01L 2224/81639* (2013.01); *H01L 2924/01322* (2013.01); *H01L 2924/061* (2013.01); *H01L 2924/0635* (2013.01); *H01L 2924/095* (2013.01); *H01L 2924/351* (2013.01)

(58) Field of Classification Search
CPC . H01L 2224/05624; H01L 2224/05644; H01L 2224/05791; H01L 2224/05805; H01L 2224/05809; H01L 2224/05839; H01L 2224/1131; H01L 2224/11515; H01L 2224/119; H01L 2224/13005; H01L 2224/13011; H01L 2224/13016; H01L 2224/1319; H01L 2224/13339; H01L 2224/13347; H01L 2224/1379; H01L 2224/13839; H01L 2224/16227; H01L 2224/81201; H01L 2224/81444; H01L 2224/81591; H01L 2224/81605; H01L 2224/81609; H01L 2224/81639; H01L 2924/01322; H01L 2924/061; H01L 2924/0635; H01L 2924/095; H01L 2924/351; H01L 2224/13561; H01L 2224/81815; H01L 2224/8185; H01L 2224/1111; H01L 2224/11334; H01L 2224/13076; H01L 2224/1357; H01L 21/50; B33Y 80/00; B29C 64/124; B29C 64/241

See application file for complete search history.

(56) References Cited

FOREIGN PATENT DOCUMENTS

| | | |
|---|---|---|
| JP | 2006-287091 A | 10/2006 |
| JP | 2007-208082 A | 8/2007 |

* cited by examiner

TERMINAL AND CONNECTION METHOD

CROSS REFERENCE TO RELATED APPLICATIONS

This application is a U.S. National Phase of International Patent Application No. PCT/JP2021/001298 filed on Jan. 15, 2021, which claims priority benefit of Japanese Patent Application No. JP 2020-032987 filed in the Japan Patent Office on Feb. 28, 2020. Each of the above-referenced applications is hereby incorporated herein by reference in its entirety.

TECHNICAL FIELD

The present disclosure relates to a terminal and a connection method. Specifically, the present disclosure relates to a terminal for connecting a semiconductor element to a substrate and a connection method using the terminal.

BACKGROUND ART

Conventionally, bare chip mounting has been performed in which a semiconductor chip on which a large number of terminals are arranged is bonded to a substrate and mounted. For example, in a case where a gold (Au) bump arranged on an LSI chip is bonded to an electrode arranged on a silicon (Si) substrate, a method for manufacturing a semiconductor device has been proposed in which the gold (Au) bump is bonded via a bonding material including a resin in which metal particles are dispersed (see Patent Document 1, for example). In this method for manufacturing a semiconductor device, a bonding material formed by dispersing silver (Ag) nanoparticles or tin (Sn) nanoparticles in an epoxy resin is used as the bonding material. This bonding material is disposed between the Au bump of the LSI chip and the electrode of the substrate, heated to 200° C., and pressed and bonded by applying a load of 19.6 N. As a result, the metal particles such as Ag are sintered like ceramic, and the Au bump and the electrode are bonded.

CITATION LIST

Patent Document

Patent Document 1: Japanese Patent Application Laid-Open No. 2007-208082

SUMMARY OF THE INVENTION

Problems to be Solved by the Invention

In the above-described conventional technique, there is a problem that a bonded portion between the semiconductor chip and the substrate is damaged by temperature stress. There is a case where the semiconductor chip and the substrate exhibit different thermal behaviors due to a difference in thermal expansion coefficient and the like between the semiconductor chip and the substrate. In such a case, there is a problem that stress concentrates on the bonded portion between the semiconductor chip and the substrate and the semiconductor chip is damaged.

The present disclosure has been made in view of the above-described problem, and an object of the present disclosure is to prevent damage to a bonded portion between a semiconductor chip and a substrate.

Solutions to Problems

The present disclosure has been made to solve the above-described problem, and a first aspect thereof is a terminal that is disposed between an electrode of an element and an electrode of a substrate on which the element is mounted, and electrically connects the electrode of the element and the electrode of the substrate, the terminal including: a plurality of unit lattices formed by bonding a plurality of beams in a cube shape; and a coupling portion that couples adjacent unit lattices among the plurality of unit lattices.

Furthermore, according to the first aspect, the beams may include resin.

Furthermore, according to the first aspect, the coupling portion may include resin.

Furthermore, according to the first aspect, a conductive member disposed adjacent to the beams and the coupling portion and having conductivity may be further included.

Furthermore, according to the first aspect, a flexible member configured in a rod shape bulging toward an inner side of the cube shape, disposed inside the cube shape of the beams, having end portions bonded to vicinities of both ends of the beams, and configured to be bent toward the inner side of the cube shape in a case where temperature rises; and a flexible member coupling portion bonded to a central portion of the beam and a central portion of the flexible member to connect the beam and the flexible member may be further included, in which the coupling portion may be bonded to the central portion of the beam of each of the adjacent unit lattices to connect the adjacent unit lattices.

Furthermore, according to the first aspect, the flexible member may have a higher thermal expansion coefficient than those of the beams.

Furthermore, according to the first aspect, the flexible member may include resin.

Furthermore, in the first aspect, the flexible member coupling portion may include resin.

Furthermore, according to the first aspect, a reinforcing member that is bonded to the plurality of beams at two vertices facing each other through a center of the cube shape of the unit lattice may be further included.

Furthermore, according to the first aspect, the reinforcing member may include resin.

In addition, a second aspect of the present disclosure is a connection method including electrically connecting an electrode of an element and an electrode of a substrate by providing a terminal between the electrode of the element and the electrode of the substrate on which the element is mounted, in which the terminal includes: a plurality of unit lattices formed by bonding a plurality of beams in a cube shape; and a coupling portion that couples adjacent unit lattices among the plurality of unit lattices.

According to the aspects of the present disclosure, there is an effect that the plurality of unit lattices formed by bonding the plurality of beams in a cube shape is respectively coupled by a coupling portion to form a terminal. With those lattice shapes, improvement of the flexibility is expected.

MODE FOR CARRYING OUT THE INVENTION

Next, modes for carrying out the present disclosure (hereinafter, referred to as an embodiment) will be described with reference to the drawings. In the following drawings, the same or similar parts are denoted by the same or similar reference signs. Furthermore, the embodiments will be described in the following order.
1. First Embodiment
2. Second Embodiment
3. Third Embodiment 1. First Embodiment

[Configuration of Semiconductor Device]

Figure 1:
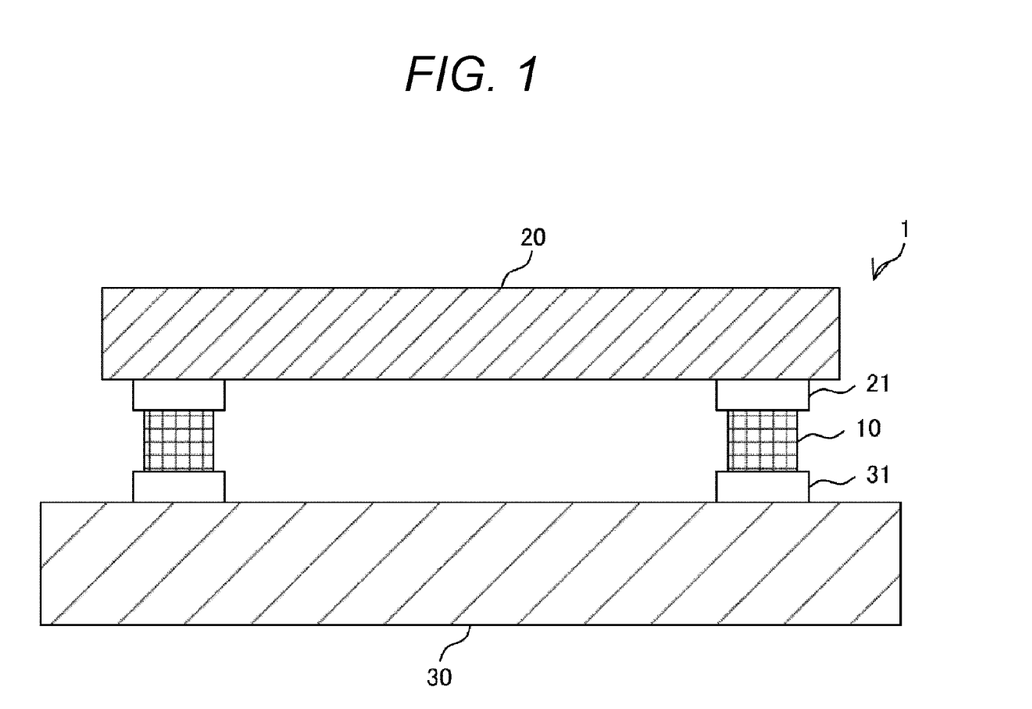
FIG. 1 is a diagram illustrating a configuration example of a semiconductor device according to a first embodiment of the present disclosure.

FIG. 1 is a diagram illustrating a configuration example of a semiconductor device according to a first embodiment of the present disclosure. A semiconductor device 1 in the drawing is configured by mounting a semiconductor chip 20 on a substrate 30.

The semiconductor chip 20 is a semiconductor chip including silicon (Si) or the like. A plurality of pads 21 is arranged on the semiconductor chip 20. The pads 21 are electrode-like terminals that transmit a signal of the semiconductor chip 20. The pads 21 can include metal such as aluminum (Al) or Au. Note that the semiconductor chip 20 is an example of an element described in the claims. The pads 21 are an example of an electrode described in the claims.

The substrate 30 is a circuit board disposed in an electronic device or the like. The semiconductor chip 20 is bare-chip mounted on the substrate 30. A plurality of lands 31 is arranged on the substrate 30. The lands 31 are conductors to which terminals such as the pads 21 of the semiconductor chip 20 are bonded. The lands 31 can include metal. Specifically, the lands 31 can include copper (Cu) and Au laminated in order. Note that the lands 31 are an example of an electrode described in the claims.

In a case where the semiconductor chip 20 is mounted on the substrate 30, the pads 21 of the semiconductor chip 20 and the lands 31 of the substrate 30 are bonded. Here, the terminals 10 are disposed between the pads 21 and the lands 31. The terminals 10 bond the pads 21 and the lands 31.

[Configuration of Terminal]

Figure 2:
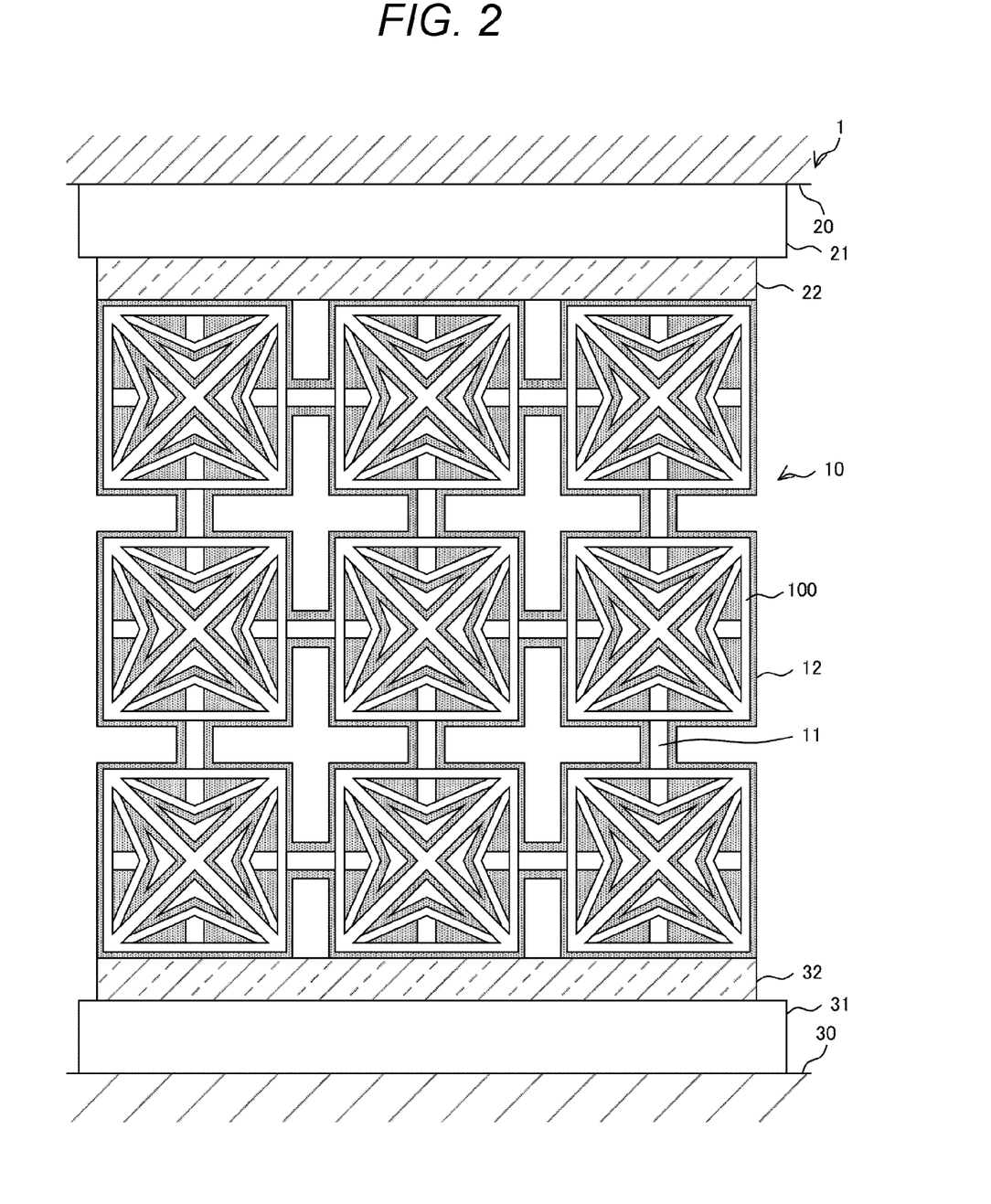
FIG. 2 is a diagram illustrating a configuration example of a terminal according to the first embodiment of the present disclosure.

FIG. 2 is a diagram illustrating a configuration example of a terminal according to the first embodiment of the present disclosure. The drawing is a diagram illustrating a configuration example of the terminal 10, and is an enlarged view of a region where the terminal 10 of the semiconductor device 1 of FIG. 1 is disposed.

As described above, the terminal 10 is disposed between the pad 21 of the semiconductor chip 20 and the land 31 of the substrate 30 to electrically connect the pad 21 of the semiconductor chip 20 and the land 31 of the substrate 30. The terminal 10 includes unit lattices 100 and coupling portions 11.

The unit lattices 100 are lattice-shaped structures formed by bonding a plurality of beams in a cube shape. The unit lattices 100 are arranged in a three-dimensional lattice shape to form the terminal 10. Details of the configuration of the unit lattices 100 will be described later.

The coupling portions 11 couple adjacent unit lattices 100 among the plurality of unit lattices 100. The unit lattices 100 are connected by the coupling portions 11, and the plurality of unit lattices 100 is arranged in a three-dimensional lattice shape. The coupling portions 11 can include, for example, resin. Details of the configuration of the coupling portions 11 will be described later.

In the drawing, for convenience, nine unit lattices 100 arranged two-dimensionally are illustrated, but the number of unit lattices 100 is not limited, and a plurality of unit lattices 100 is further arranged in the depth direction of the paper surface of the drawing to form a three-dimensional shape.

Furthermore, the terminal 10 in the drawing includes conductive members 12. The conductive members 12 are members having conductivity and disposed adjacent to the unit lattices 100 and the coupling portions 11. The hatched regions in the drawing represent the conductive members 12. This drawing illustrates an example in which films of the conductive members 12 are attached and disposed on surfaces of the unit lattices 100 and the coupling portions 11. The conductive member 12 can include, for example, a resin in which particles of metal such as Ag are dispersed. By disposing the conductive member 12, conductivity can be imparted to the terminals 10 and the pads 21 and the lands 31 can be electrically connected to each other even in a case where the unit lattices 100 and the coupling portions 11 including an insulator are used. The conductive member 12 can be formed by attaching a liquid resin in which metal particles are dispersed to the surfaces of the unit lattices 100 and the coupling portions 11 and curing the resin.

Furthermore, a connecting portion 22 is disposed between the pad 21 and the terminal 10 in the drawing, and a connecting portion 32 is disposed between the terminal 10 and the land 31. The connecting portions 22 and 32 connect the terminal 10, the pad 21, and the land 31. The connecting portions 22 and 32 include, for example, a conductive adhesive such as silver paste, solder having a low melting point, or the like, and bond the terminal 10 to the pad 21 and the land 31. By arranging the connecting portions 22 and 32, the terminal 10 can be electrically and mechanically connected to the pad 21 and the land 31.

Furthermore, as the connecting portions 22 and 32, an elastomer containing a liquid metal such as eutectic gallium indium (EGaIn), for example, can also be used. By applying the elastomer containing the eutectic gallium indium to the connecting portions between the pad 21, the land 31, and the terminal 10 and applying pressure thereto, liquid metals in the elastomer are bonded to each other, and electrical connection can be obtained. Furthermore, since the bonded liquid metal has a self-repairing function, the reliability of the connecting portion with the pad 21 and the like can be improved.

The semiconductor device 1 can be manufactured as follows. First, the connecting portions 22 are disposed on the pads 21 of the semiconductor chip 20. Next, the terminals 10 are placed adjacent to the connecting portions 22 arranged on the pads 21, and the connection portions 22 are cured to connect the terminals 10 to the pads 21. Next, the connecting portions 32 are disposed on the lands 31 of the substrate 30. Next, the semiconductor chip 20 is mounted on the substrate 30 while aligning the pads 21, to which the terminals 10 are connected, with the lands 31 on which the connecting portions 32 are disposed. Here, the terminals 10 are disposed between the pads 21 and the lands 31. Next, the connecting portions 32 are cured to connect the terminals 10 to the lands 31. Through the above steps, the semiconductor chip 20 can be mounted on the substrate 30.

[Configuration of Unit Lattice]

Figure 3:
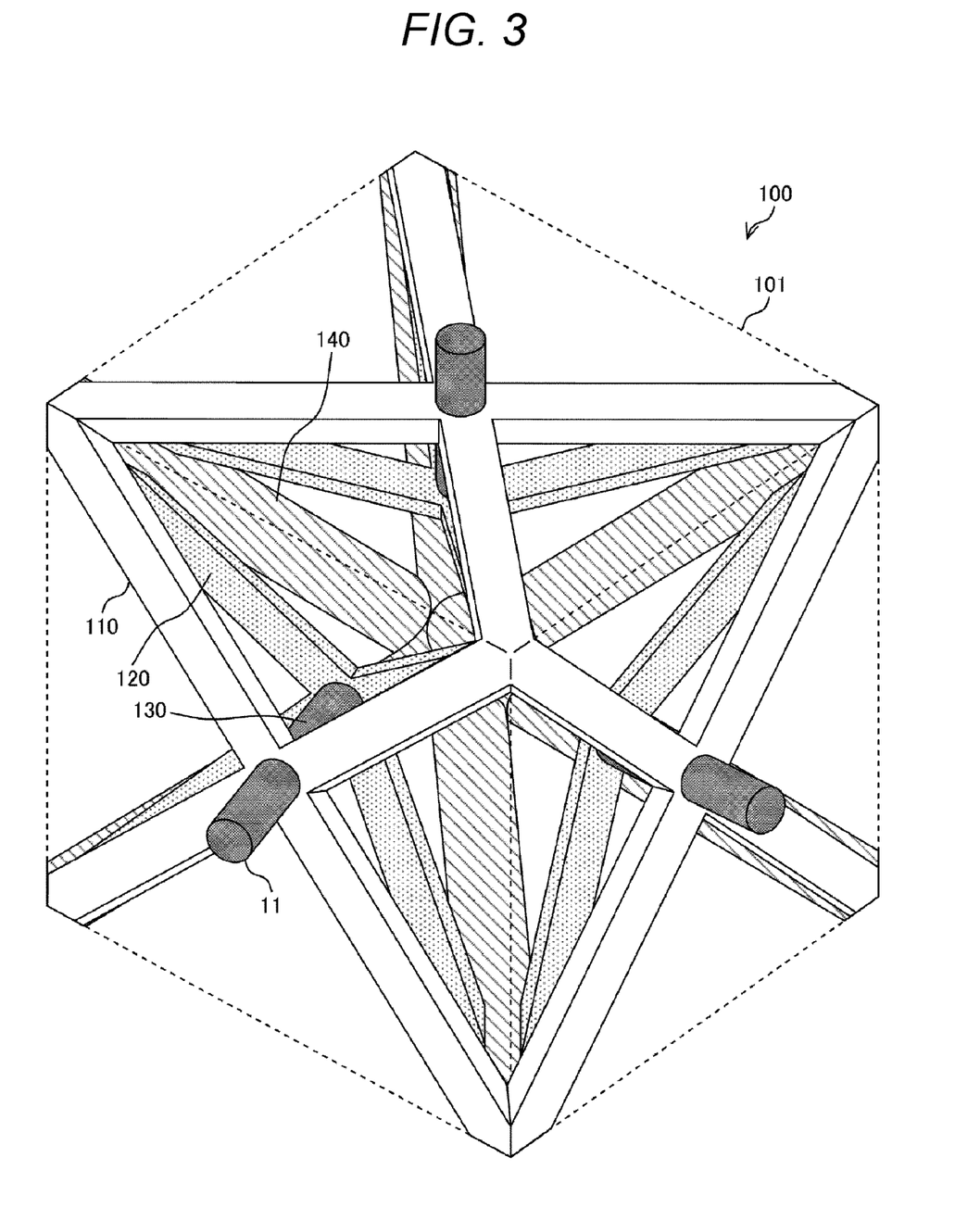
FIG. 3 is a diagram illustrating a configuration example of a unit lattice according to an embodiment of the present disclosure.

FIG. 3 is a diagram illustrating a configuration example of the unit lattice according to the embodiment of the present disclosure. The drawing is a diagram illustrating a configuration example of the unit lattice 100. The unit lattice 100 in the drawing includes beams 110, flexible members 120, reinforcing members 140, and flexible member coupling portions 130. Note that, in the unit lattice 100 of the drawing, the coupling portions 11 are also illustrated. A cube 101 indicated by broken lines in the drawing is auxiliary lines representing the outer shape of the unit lattice 100, and is not what constitutes the unit lattice 100.

The beam 110 is formed in a rod shape and joined in a cube shape. The plurality of beams 110 is bonded to each other to form the outer shape of the unit lattice 100. The beams 110 represent an example of being arranged between opposing vertices on each surface of the cube 101. Furthermore, the beams 110 in the drawing represent an example in which two beams 110 intersect and are configured in a diagonal manner on each surface of the cube 101. The beams 110 may include resin, for example.

The flexible members 120 bend the beams 110 inward of the cube 101. The flexible member 120 is formed in a rod shape bulging toward the inside of the cube 101, is disposed inside the cube 101 of the beams 110, and has end portions joined to the vicinities of both ends of the beams 110. The flexible member 120 may be disposed on each of the plurality of beams 110. Furthermore, similarly to the beams 110, the flexible members 120 can be configured in a shape in which the two flexible members 120 intersect on each surface of the cube 101. The flexible members 120 can include a member having a higher thermal expansion coefficient than those of the beams 110, for example, a resin having a higher thermal expansion coefficient than the member constituting the beams 110. In this case, the flexible members 120 extend longer than the beams 110 when the temperature rises. With this configuration, the flexible members 120 are deformed into a shape that bends inward of the cube 101 as the temperature rises.

The flexible member coupling portions 130 are configured in a rod shape to couple the beams 110 and the flexible members 120. The flexible member coupling portions 130 are bonded to a central portion of the beams 110 and a central portion of the flexible members 120 to couple the beams 110 and the flexible members 120. The flexible member coupling portions 130 in the drawing are arranged on each surface of the cube 101. By providing the flexible member coupling portions 130, the beams 110 can be bent to the inner side of the cube 101 in a case where the flexible members 120 are bent as the temperature rises. The flexible member coupling portions 130 can include resin, for example.

The reinforcing members 140 reinforce the plurality of beams 110 bonded to each other. The reinforcing members 140 are disposed between two vertices facing each other through the center of the cube 101, and are bonded to the beams 110 at these two vertices. This drawing illustrates an example in which the four reinforcing members 140 are configured to intersect at the central portion of the cube 101. The reinforcing members 140 can include resin, for example.

Note that the coupling portions 11 can be disposed on a side of the beams 110 different from the side on which the flexible member coupling portions 130 are disposed.

As described above, the beams 110, the flexible members 120, the flexible member coupling portions 130, the reinforcing members 140, and the coupling portions 11 can include resin. To this resin, a photocurable resin may be applied. Specifically, these beams 110 and the like can include polyethylene glycol diacrylate (PEGDA) imparted with photo-curability. Therefore, the terminal 10 can be manufactured using a 3D printer or the like.

By configuring the terminal 10 with the plurality of unit lattices 100 connected by the coupling portions 11, flexibility can be imparted to the terminal 10. As a result, even in a case where the semiconductor device 1 is distorted with an increase in temperature due to a difference in thermal expansion coefficient and the like between the semiconductor chip 20 and the substrate 30, and stress is applied to the terminals 10, the stress can be dispersed. The terminals 10 can be prevented from being damaged.

Note that the thermal expansion coefficient of PEGDA is $1.56 \times 10^{-4} [\text{K}^{-1}]$. The thermal expansion coefficient can be adjusted by adding a reinforcing material to the PEGDA. Specifically, the thermal expansion coefficient of PEGDA can be reduced by adding Cu nanoparticles (particle size: 50 to 80 nm). This is because the thermal expansion coefficient of Cu to be added is as low as $2 \times 10^{-5}$. For example, by adding 5% of Cu nanoparticles, the thermal expansion coefficient of PEGDA can be reduced to $5.1 \times 10^{-5} [\text{K}^{-1}]$.

Therefore, the flexible members 120 include PEGDA, and the beams 110, the flexible member coupling portions 130, the reinforcing members 140, and the coupling portions 11 include PEGDA reinforced by adding Cu nanoparticles. As a result, the thermal expansion coefficient of the flexible members 120 can be made higher than the thermal expansion coefficient of the beams 110 and the like, and the beams 110 can be bent to the inner side of the cube 101 when the temperature rises. The beams 110 can be deflected to the inside of the unit lattice 100.

[Shrinkage of terminal]

Figure 4A:
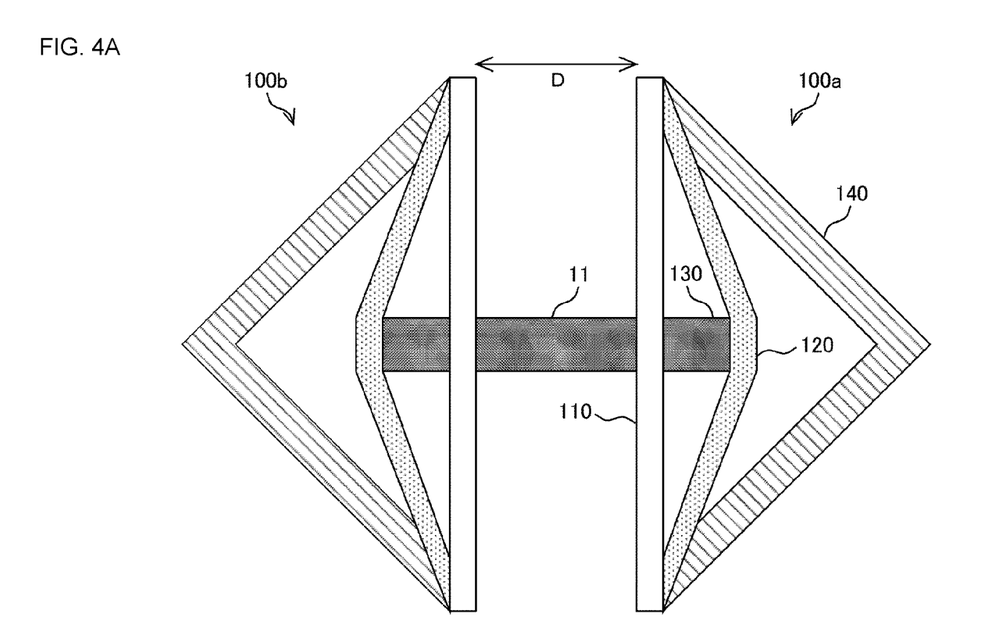
FIGS. 4A and 4B are diagrams illustrating an example of shrinkage of the terminal according to an embodiment of the present disclosure.
Figure 4B:
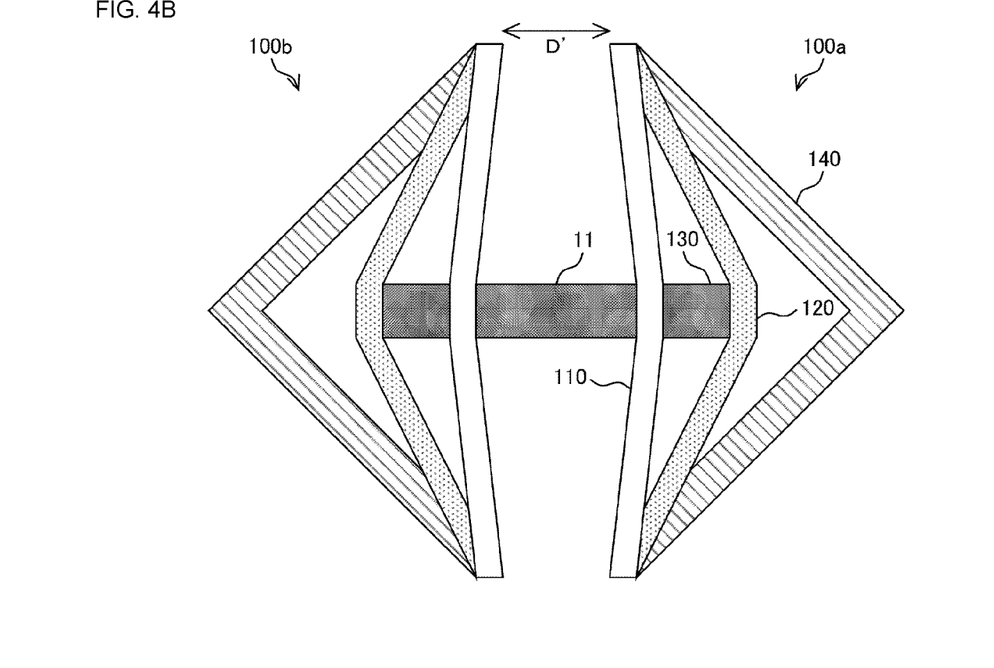

FIGS. 4A and 4B are views illustrating an example of shrinkage of the terminal according to the embodiment of the present disclosure. This drawing is a diagram illustrating behavior of the coupled unit lattices 100 in a case where the temperature of the terminals 10 rises. Furthermore, the drawing is a view illustrating a pair of beams 110, the flexible members 120, the flexible member coupling portions 130, and the reinforcing members 140 of each of the unit lattices 100a and 100b connected by the coupling portion 11.

FIG. 4A is a view illustrating a state of the unit lattices 100a and 100b before the temperature is raised. "D" in FIG. 4A represents an interval between the unit lattices 100a and 100b before the temperature is raised.

FIG. 4B is a view illustrating a state of the unit lattices 100a and 100b after the temperature is raised. As the temperature rises, the flexible members 120 extend. As described above, the flexible members 120 are configured in a shape in which both ends are joined to the beams 110 and the reinforcing members 140 and a central portion bulges inside the cube 101. Therefore, in a case where the temperature rises, the flexible members 120 extend and the central portion bends inward of the cube 101. As a result, the beams 110 connected to the flexible members 120 by the flexible member coupling portions 130 are drawn into the cube 101 and bent. In a case where the deflection amount of the beams 110 is larger than the elongation amount of the coupling portions 11, the unit lattices 100a and 100b becomes close to each other. "D" in FIG. 4B represents an interval between the unit lattices 100a and 100b after the temperature rise, and is narrower than "D" in FIG. 4A. The terminal 10 configured by connecting such unit lattices 100 has a property that the volume decreases as the temperature rises. Note that, for the sake of convenience, in FIG. 4B, description of elongation of members other than the flexible members 120 caused by a temperature rise is omitted.

As described above, by making the thermal expansion coefficient of the flexible members 120 higher than that of the beams 110, the thermal expansion coefficient of the terminal 10 can be set to a negative value. In addition, the terminal 10 having an arbitrary thermal expansion coefficient can be configured by adjusting the thermal expansion coefficient of the flexible members 120, the beams 110, and the like. For example, a terminal 10 having a thermal expansion coefficient of the value "zero" can also be configured. The terminals 10 having a thermal expansion coefficient corresponding to the thermal behavior of the semiconductor chip 20 and the substrate 30 can be arranged, and damage of the bonded portion between the semiconductor chip 20 and the substrate 30 can be prevented.

[Method of Manufacturing Terminal]

Figure 5:
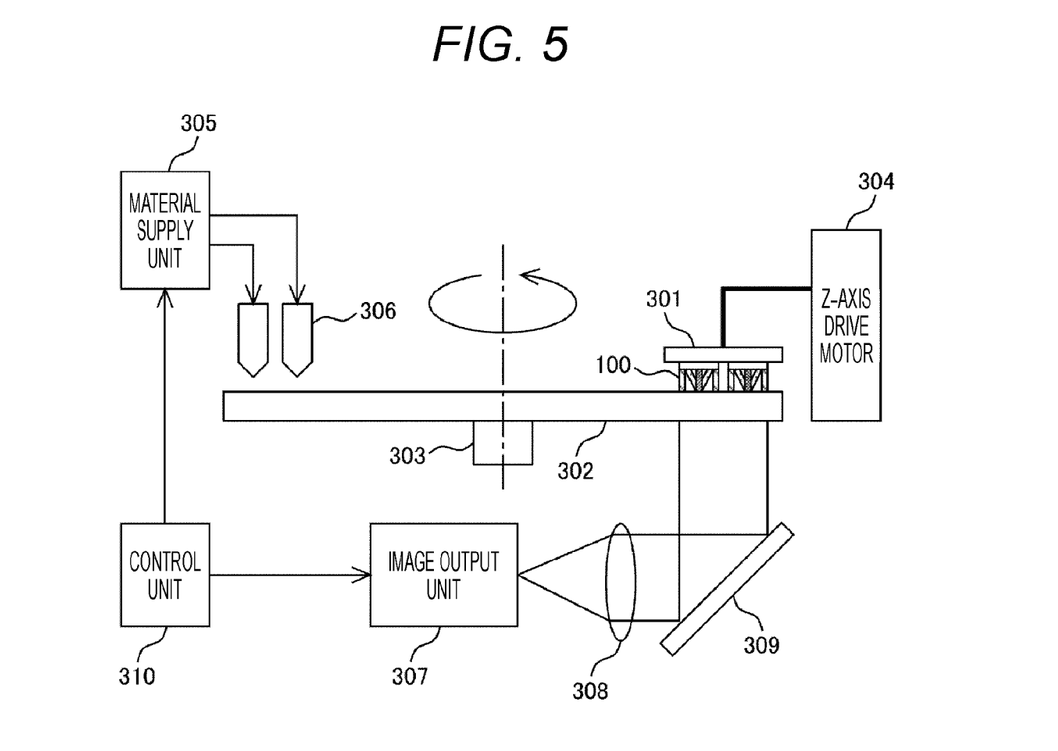
FIG. 5 is a diagram illustrating an example of a method of manufacturing the terminal according to an embodiment of the present disclosure.

FIG. 5 is a diagram illustrating an example of a method of manufacturing the terminal according to an embodiment of the present disclosure. The drawing is a diagram illustrating an example of a 3D printer device that manufactures the terminal 10. The 3D printer device in the drawing includes a sample holding unit 301, a material conveying disk 302, a motor 303, a Z-axis drive motor 304, a material supply unit 305, a dispenser 306, an image output unit 307, an optical system including a lens 308 and a reflector 309, and a control unit 310.

The sample holding unit 301 holds the terminal 10 which is being manufactured. The terminal 10 is held on the lower surface of the sample holding unit 301.

The dispenser 306 holds a resin material constituting the beams 110 and the like. The beams 110 and the like include a photocurable resin. The dispenser 306 holds the uncured resin material. The dispenser 306 supplies a resin material to the material conveying disk 302 described later under the control of the material supply unit 305. The dispenser 306 which is suitable for the type of resin material can be disposed.

The material supply unit 305 supplies the material resin to the dispenser 306 under the control of the control unit 310. The material supply unit 305 supplies, to the dispenser 306, a resin material suitable for the part of the terminal 10 to be formed.

The material conveying disk 302 conveys the resin material supplied by the dispenser 306 to a section for forming the terminal 10. The material conveying disk 302 rotates to convey the resin material. Note that the section for forming the terminal 10 is an area immediately below the sample holding unit 301.

The motor 304 rotates the material conveying disk 302. A stepping motor can be used as the motor 304.

The image output unit 307 emits light for curing the resin material under the control of the control unit 310. The image output unit 307 emits light on the basis of image data configured by decomposing the image of the terminal 10 into multiple layers in the Z-axis direction.

The optical system guides the light emitted from the image output unit 307 to the unit for forming the terminal 10.

The Z-axis drive motor 304 moves the sample holding unit 301 in the Z-axis direction. The Z-axis drive motor 304 moves the sample holding unit 301 upward in the drawing at a speed corresponding to the formation of the terminal 10.

The control unit 310 controls the entire manufacturing apparatus. The control unit 310 controls the image output unit 307 and the material supply unit 305 on the basis of the configuration data of the terminal 10 to form the terminal 10 on the lower surface of the sample holding unit 301. For example, in a case where the beams 110 and the reinforcing members 140 are formed, a material resin (PEGDA before curing in which Cu is dispersed) used for the beams 110 and the like is supplied from the dispenser 306 to the material conveying disk 302. On the other hand, light corresponding to one layer of image data for forming the beams 110 and the like is emitted from the image output unit 307 and guided to the section for forming the terminal 10. As a result, the material resin is cured at the section for forming the terminal 10, and the beams 110 and the like for one layer are formed. Next, a material resin (PEGDA before curing) of the flexible members 120 is supplied from the dispenser 306 to the material conveying disk 302, and light for one layer of image data for forming the flexible members 120 is emitted from the image output unit 307, and the flexible members 120 for one layer is formed. By performing this for all the layers, the terminal 10 can be manufactured.

As described above, the terminal 10 of the first embodiment of the present disclosure includes the unit lattices 100 and the coupling portions 11, and is configured to have a flexible structure. With this configuration, in a case where stress is applied to the terminal 10 due to distortion caused by an increase in the temperature of the semiconductor chip 20 and the substrate 30, the stress can be dispersed to prevent damage to the terminal 10.

2. Second Embodiment

The terminal 10 according to the above-described first embodiment is configured to have a single thermal expansion coefficient. On the other hand, a terminal according to a second embodiment of the present disclosure is different from the above-described first embodiment in that terminal regions having different thermal expansion coefficients are stacked.

[Configuration of Semiconductor Device]

Figure 6:
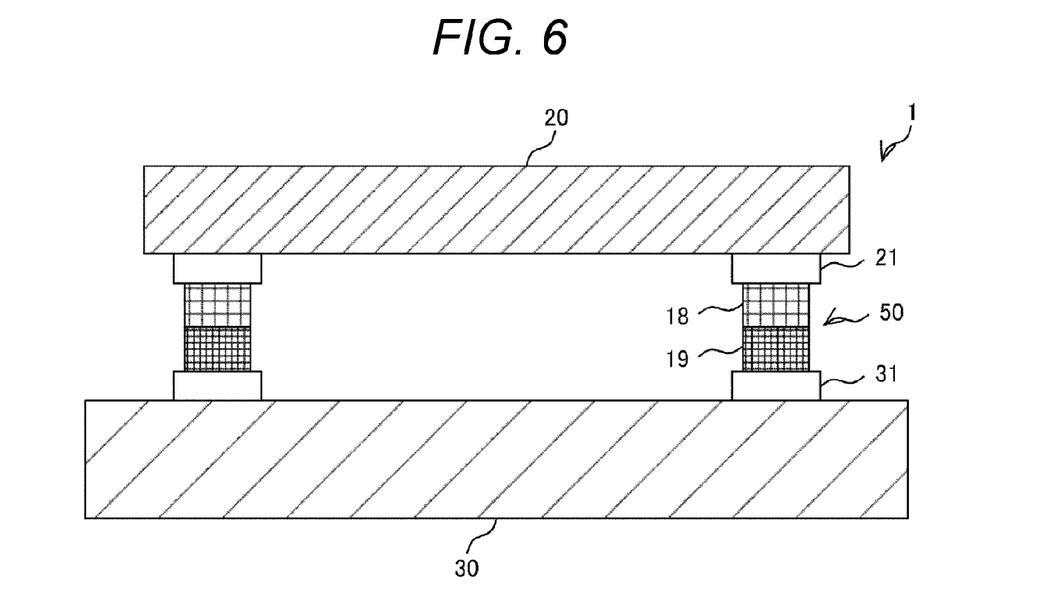
FIG. 6 is a diagram illustrating a configuration example of a semiconductor device according to a second embodiment of the present disclosure.

FIG. 6 is a diagram illustrating a configuration example of a semiconductor device according to the second embodiment of the present disclosure. The drawing is a diagram illustrating a configuration example of the semiconductor device 1 similarly to FIG. 1. The semiconductor device 1 is different from the semiconductor device 1 of FIG. 1 in that a terminal 50 is disposed instead of the terminal 10.

The terminal 50 in the drawing includes two stacked terminal regions 18 and 19. Each of the terminal regions 18 and 19 is a terminal region including the unit lattices 100 and the coupling portions 11. The terminal regions 18 and 19 are disposed adjacent to pads 21 and lands 31, respectively. The flexible members 120 disposed in the unit lattices 100 in the terminal regions 18 and 19 can be configured to have different thermal expansion coefficients. With this arrangement, the terminal regions 18 and 19 can be configured to have different thermal expansion coefficients. By configuring the terminal regions 18 and 19 to have thermal expansion coefficients corresponding to the pads 21 and the lands 31, respectively, stress applied to the terminals 50 can be concentrated on the bonded portions of the terminal regions 18 and 19. The stress of the connecting portion between the terminal 50 and the pads 21 and the lands 31 can be reduced.

Since the configuration of the terminal 50 other than this part is similar to the configuration of the terminal 10 described in the first embodiment of the present disclosure, the description thereof will be omitted.

As described above, in the terminal 50 according to the second embodiment of the present disclosure, by arranging the terminal regions 18 and 19 having different thermal expansion coefficients, the stress applied to the connecting portion between the terminal 50 and the pad 21 and the land 31 can be reduced. Breakage in the connecting portion between the terminal 50 and the pad 21 and the land 31 can be prevented.

3. Third Embodiment

In the terminal 10 of the first embodiment described above, the film-like conductive members 12 are disposed to be attached to the surfaces of the unit lattices 100 and the coupling portions 11. On the other hand, a terminal of a third embodiment of the present disclosure is different from the above-described first embodiment in that a plurality of unit lattices 100 connected by coupling portions 11 is filled with a conductive member.

[Configuration of Terminal]

Figure 7:
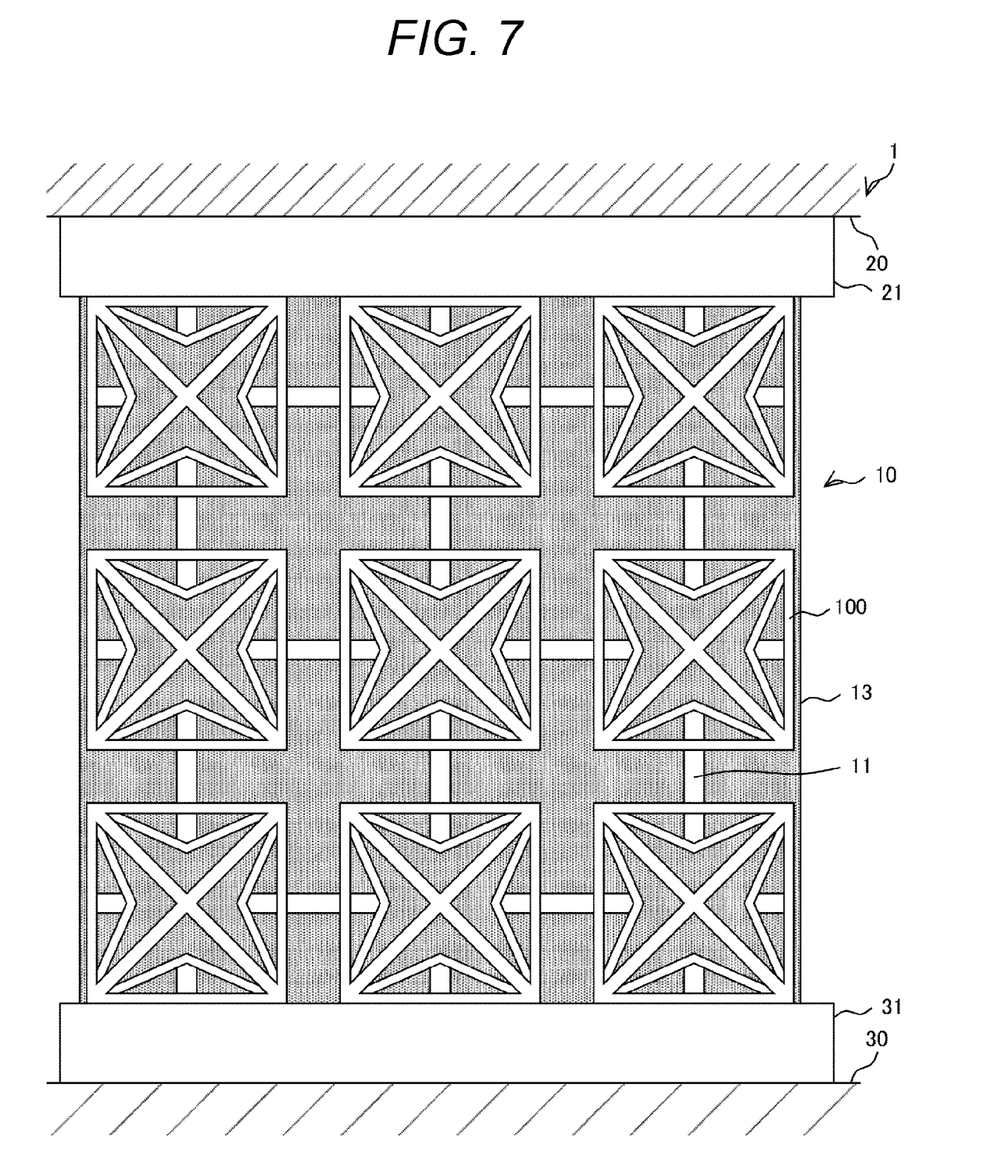
FIG. 7 is a diagram illustrating a configuration example of a terminal according to a third embodiment of the present disclosure.

FIG. 7 is a diagram illustrating a configuration example of a terminal according to the third embodiment of the present disclosure. The drawing is a diagram illustrating a configuration example of the terminal 10 similarly to FIG. 2. The terminal 10 is different from the terminal in FIG. 2 in that the connecting portions 22 and 32 are omitted and a conductive member 13 is disposed as a substitute for the conductive members 12.

The conductive member 13 is a conductive member which is arranged by filling a plurality of unit lattices 100 connected by the coupling portions 11. The conductive member 13 can include a liquid metal such as eutectic gallium indium. The terminal 10 can be configured by impregnating and filling the unit lattices 100 with the conductive member 13. In this case, the connecting portions 22 and 32 can be omitted. Furthermore, the conductive member 13 may be formed by dispersing metal particles in a resin having high flexibility even after curing.

In addition, a material containing nanoparticles of Ag or Cu whose size and shape are controlled so as to have plasmon resonance can be filled in the plurality of unit lattices 100 connected by the coupling portions 11. After the filling, the nanoparticles are irradiated with light and fired by a thermal conversion effect by resonance of light. Here, the firing of the nanoparticles can be adjusted by adjusting the intensity and frequency of the light to be irradiated, and the flexibility of the terminal 10 can be adjusted. Furthermore, it is also possible to adjust a condition of light to be emitted according to an element such as the semiconductor chip 20 and arrange a terminal 10 having different flexibility for each element.

Since the configuration of the terminal 10 other than this part is similar to the configuration of the terminal 10 described in the first embodiment of the present disclosure, the description thereof will be omitted.

As described above, in the terminal 10 according to the third embodiment of the present disclosure, the connecting portions 22 and 32 can be omitted by disposing the conductive member 13 filled in the plurality of unit lattices 100 connected by the coupling portions 11. The configuration of the semiconductor device 1 can be simplified.

Note that the configuration of the terminal 10 according to the third embodiment can be combined with other embodiments. Specifically, the conductive member 13 of FIG. 7 can be used instead of the conductive member 12 of FIG. 6.

Finally, note that the description of each of the above-described embodiments is an example of the present disclosure, and the present disclosure is not limited to the above-described embodiments. Therefore, it is needless to say that various modifications can be made according to the design and the like without departing from the technical idea according to the present disclosure even with other embodiments which are not the above-described respective embodiments.

Furthermore, the effects described in the present specification are merely examples and are not limited. In addition, there may be additional effects.

In addition, the drawings in the above-described embodiments are schematic, and dimensional ratios and the like of the respective portions do not necessarily coincide with actual ones. In addition, it is needless to say that the drawings include portions having different dimensional relationships and ratios.

Note that the present technology may have following configurations.

(1) A terminal that is disposed between an electrode of an element and an electrode of a substrate on which the element is mounted, and electrically connects the electrode of the element and the electrode of the substrate, the terminal including:
  a plurality of unit lattices formed by bonding a plurality of beams in a cube shape; and
  a coupling portion that couples adjacent unit lattices among the plurality of unit lattices.

(2) The terminal according to (1), in which the beams include resin.

(3) The terminal according to (1) or (2), in which the coupling portion includes resin.

(4) The terminal according to any one of (1) to (3), further including a conductive member disposed adjacent to the beams and the coupling portion and having conductivity.

(5) The terminal according to any one of (1) to (4), further including:
  a flexible member configured in a rod shape bulging toward an inner side of the cube shape, disposed inside the cube shape of the beams, having end portions bonded to vicinities of both ends of the beams, and configured to be bent toward the inner side of the cube shape in a case where temperature rises; and
  a flexible member coupling portion bonded to a central portion of the beam and a central portion of the flexible member to connect the beam and the flexible member,
  in which the coupling portion is bonded to the central portion of the beam of each of the adjacent unit lattices to connect the adjacent unit lattices.

(6) The terminal according to (5), in which the flexible member has a higher thermal expansion coefficient than those of the beams.

(7) The terminal according to (5), in which the flexible member includes resin.

(8) The terminal according to (5), in which the flexible member coupling portion includes resin.

(9) The terminal according to any one of (1) to (8), further including a reinforcing member configured to be bonded to the plurality of beams at two vertices facing each other through a center of the cube shape of the unit lattice.

(10) The terminal according to (9), in which the reinforcing member includes resin.

(11) A connection method including electrically connecting an electrode of an element and an electrode of a substrate by providing a terminal between the electrode of the element and the electrode of the substrate on which the element is mounted, the terminal including: a plurality of unit lattices formed by bonding a plurality of beams in a cube shape; and a coupling portion that couples adjacent unit lattices among the plurality of unit lattices.

REFERENCE SIGNS LIST

1 Semiconductor device
10, 50 Terminal
11 Coupling portion
12 Conductive member
18, 19 Terminal region
20 Semiconductor chip
21 Pad
22, 32 Connecting portion
30 Substrate
31 Land
100, 100a, 100b Unit lattice
101 Cube
110 Beam
120 Flexible member
130 Flexible member coupling portion
140 Reinforcing member

The invention claimed is:

1. A terminal that is disposed between an electrode of an element and an electrode of a substrate on which the element is mounted, and electrically connects the electrode of the element and the electrode of the substrate, the terminal comprising:
a plurality of unit lattices formed by bonding a plurality of beams in a cube shape; and
a coupling portion that couples adjacent unit lattices among the plurality of unit lattices.

2. The terminal according to claim 1, wherein the plurality of beams includes resin.

3. The terminal according to claim 1, wherein the coupling portion includes resin.

4. The terminal according to claim 1, further comprising a conductive member disposed adjacent to the plurality of beams and the coupling portion and having conductivity.

5. The terminal according to claim 1, further comprising:
a flexible member configured in a rod shape bulging toward an inner side of the cube shape, disposed inside the cube shape of the plurality of beams, having end portions bonded to vicinities of both ends of the plurality of beams, and configured to be bent toward the inner side of the cube shape in a case where temperature rises; and
a flexible member coupling portion bonded to a central portion of the plurality of beams and a central portion of the flexible member to connect the plurality of beams and the flexible member,
wherein the flexible member coupling portion is bonded to the central portion of the plurality of beams of each of the adjacent unit lattices to connect the adjacent unit lattices.

6. The terminal according to claim 5, wherein the flexible member has a higher thermal expansion coefficient than those of the plurality of beams.

7. The terminal according to claim 5, wherein the flexible member includes resin.

8. The terminal according to claim 5, wherein the flexible member coupling portion includes resin.

9. The terminal according to claim 1, further comprising a reinforcing member configured to be bonded to the plurality of beams at two vertices facing each other through a center of the cube shape of a unit lattice of the plurality of unit lattices.

10. The terminal according to claim 9, wherein the reinforcing member includes resin.

11. A connection method comprising electrically connecting an electrode of an element and an electrode of a substrate by providing a terminal between the electrode of the element and the electrode of the substrate on which the element is mounted, the terminal including: a plurality of unit lattices formed by bonding a plurality of beams in a cube shape; and a coupling portion that couples adjacent unit lattices among the plurality of unit lattices.

* * * * *